United States Patent
Golper et al.

(10) Patent No.: US 10,120,133 B2
(45) Date of Patent: Nov. 6, 2018

(54) EDGE CONSTRUCTION ON OPTICAL DEVICES

(71) Applicant: Kotura, Inc., Monterey Park, CA (US)

(72) Inventors: Scott Benjamin Golper, Redondo Beach, CA (US); William Dos Santos Fegadolli, Pasadena, CA (US); Arin Abed, Glendale, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 0 days.

(21) Appl. No.: 14/974,515

(22) Filed: Dec. 18, 2015

(65) Prior Publication Data
US 2017/0176682 A1    Jun. 22, 2017

(51) Int. Cl.
| G02B 6/12 | (2006.01) |
| G02B 6/136 | (2006.01) |
| G02B 6/122 | (2006.01) |
| G02B 6/30 | (2006.01) |
| H01L 21/78 | (2006.01) |

(52) U.S. Cl.
CPC .............. G02B 6/136 (2013.01); G02B 6/122 (2013.01); G02B 6/30 (2013.01); H01L 21/78 (2013.01); G02B 2006/12092 (2013.01)

(58) Field of Classification Search
CPC .......... G02B 6/136; G02B 6/122; G02B 6/30; G02B 2006/12092; H01L 21/78
USPC .......................................................... 385/14
See application file for complete search history.

(56) References Cited

U.S. PATENT DOCUMENTS

| 5,259,049 | A | 11/1993 | Bona et al. | |
| 6,879,757 | B1 | 4/2005 | Zhou et al. | |
| 6,993,225 | B2 * | 1/2006 | Patel | G02B 6/42 385/30 |
| 9,835,801 | B1 * | 12/2017 | Qian | G02B 6/30 |
| 2002/0110341 | A1 * | 8/2002 | Yuang | H01L 31/02161 385/129 |
| 2004/0114869 | A1 * | 6/2004 | Fike | G02B 6/124 385/43 |
| 2004/0130001 | A1 * | 7/2004 | Headley | G02B 6/4207 257/620 |
| 2004/0202418 | A1 * | 10/2004 | Ghiron | G02B 6/34 385/36 |

(Continued)

FOREIGN PATENT DOCUMENTS

WO    2015/153504 A1    10/2015

OTHER PUBLICATIONS

Copenheaver, Blaine R., International Search Report and Written Opinion, PCT/US2016/065282, dated Apr. 6, 2017.

(Continued)

*Primary Examiner* — Ryan Lepisto
*Assistant Examiner* — Guy Anderson
(74) *Attorney, Agent, or Firm* — Gavrilovich, Dodd & Lindsey, LLP (57) ABSTRACT

A method of forming an optical device includes obtaining a wafer having multiple optical device dies that each includes a waveguide. The method also includes forming a facet on the waveguide of different dies. The method further includes separating the dies from the wafer after forming the facets. The dies are separated from the wafer such that the facets are positioned at an edge of the dies.

20 Claims, 7 Drawing Sheets

(56) References Cited

U.S. PATENT DOCUMENTS

| | | | |
|---|---|---|---|
| 2005/0110157 A1* | 5/2005 | Sherrer | G02B 6/4201 257/776 |
| 2005/0175286 A1* | 8/2005 | Patel | G02B 6/42 385/43 |
| 2006/0239605 A1* | 10/2006 | Palen | G02B 6/4206 385/14 |
| 2011/0135265 A1* | 6/2011 | Park | G02B 6/13 385/129 |
| 2012/0093456 A1* | 4/2012 | Taillaert | G02B 6/1228 385/14 |
| 2013/0229701 A1 | 9/2013 | Feng et al. | |
| 2014/0264400 A1* | 9/2014 | Lipson | H01L 27/144 257/88 |
| 2015/0140710 A1* | 5/2015 | McLaurin | H01S 5/34333 438/31 |
| 2015/0229108 A1* | 8/2015 | Steigerwald | H01S 5/4093 372/45.01 |
| 2017/0051884 A1* | 2/2017 | Raring | H01S 5/02236 |

OTHER PUBLICATIONS

Athina Nickitas-Etienne, International Preliminary Report on Patentability and Written Opinion, PCT/US2016/065282, The International Bureau of WIPO, dated Jun. 28, 2018.

\* cited by examiner

EDGE CONSTRUCTION ON OPTICAL DEVICES

FIELD

The present invention relates to optical devices and more particularly to construction at the edges of optical devices.

BACKGROUND

Optical devices are generally fabricated by forming multiple devices on a single wafer and then separating the devices from that wafer. These optical devices typically include one or more waveguides that terminate in facets through which light signals enter and/or exit the waveguide. The waveguide facets are typically located at the edge of the device and are formed when separating the devices from the wafer. For instance, the devices are often separated by a dicing process that also forms the facets on the waveguides. However, the facets formed by dicing are rough and accordingly produce undesirably high levels of optical loss. As a result, the facets are typically polished after dicing. This polishing is typically associated with long cycle times. Additionally, this method produces low yield levels due to the high levels of manual handling. As a result, there is a need for optical devices with improved edge structures and/or for improved methods of forming the edges of optical devices.

SUMMARY

A method of forming an optical device includes obtaining a wafer having multiple optical device dies that each includes a waveguide. The method also includes forming a facet on the waveguide of different dies. The method further includes separating the dies from the wafer after forming the facets. The dies are separated from the wafer such that the facets are positioned at an edge of the dies.

An optical system includes an optical device having a waveguide on a base. The waveguide including a facet located at a lateral side of the device. The facet is positioned above a facet shelf that extends outward from the facet to a recess wall. A recess shelf extends outwards from the recess wall to an edge wall. The edge wall is an outermost side of the optical device.

BRIEF DESCRIPTION OF THE FIGURES

FIG. 2A through FIG. 2C illustrate a portion of an optical device that includes a waveguide and a facet.

FIG. 3A and FIG. 3B illustrate a system having an optical fiber interfaced with the optical device of FIG. 2A through FIG. 2C.

FIG. 4A through FIG. 4J illustrate a method for generating an optical device constructed according to FIG. 2A through FIG. 2C.

DESCRIPTION

A method is disclosed where multiple optical device dies are formed on a wafer. The dies include waveguides that carry light signals to and/or from optical components on the dies. Facets are formed on the waveguides such that the facets are each located at an edge of the die. After formation of the facets, the dies are separated from the wafer. The method used to separate the dies from the wafer is different from the method used to form the facets on the waveguides. For instance, the facets can be etched and the dies can be separated by dicing. As a result, the disclosed method provides the advantages of etched facets in combination with the increased efficiency of separation mechanisms such as dicing.

Facets formed through etching can generate lower levels of back reflection facets formed through polishing. For instance, the inventors have found that etch facets can produce at least 5 dB or even 10 dB less back reflection than polished facets. As a result, there is no need to polish the etched facets and the physical handling of the dies is accordingly reduced. Further, forming the facets before separating the dies permits formation of an anti-reflective coating on the facets before separation of the dies from the wafer. Forming the anti-reflective coating at the wafer stage further reduces handling of the individual dies.

Figure 1A:
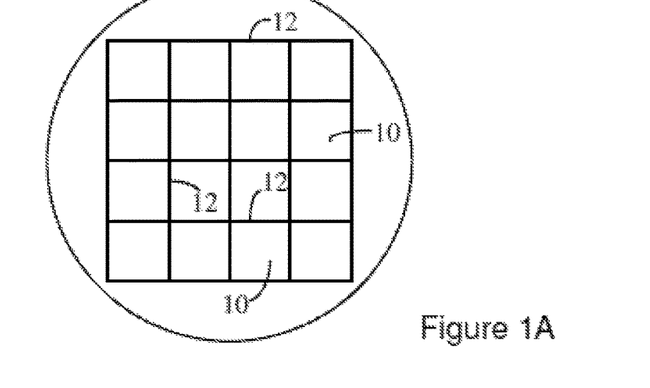
FIG. 1A is a topview of a wafer that includes multiple optical devices.

FIG. 1A is a topview of a wafer that includes optical device dies 10. At least a portion of the dies 10 on the wafer are the same. In some instances, all of the dies 10 are the same. The dies 10 can be separated from the wafer so they are independent of each other. Upon separating each die 10 from the wafer, the dies 10 can be an optical device or can be a precursor for an optical device. When a separated die 10 is a precursor for an optical device, there is some additional processing of the die 10 that occurs before the die 10 serves as the completed optical device. Accordingly, all or a portion of the optical device is formed on each of the dies before separating the dies from the wafer. Separating the devices from the wafer includes separating them from one another.

As a result, the lines 12 on FIG. 1A that illustrate the boundary or perimeter of adjacent devices can represent lines along which the devices are separated from one another and/or from the wafer.

Figure 1B:
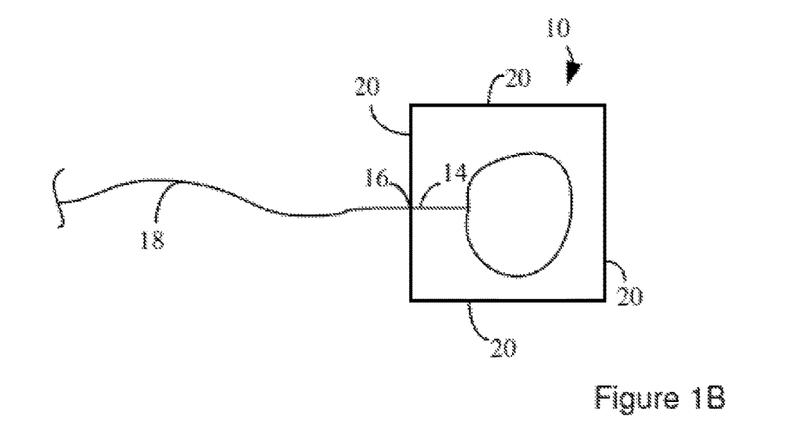
FIG. 1B is a topview of an optical device after the optical device is separated from the wafer of FIG. 1A.

FIG. 1B is a topview of a die 10 after the die 10 is separated from the wafer. The optical device includes one or more waveguides 14 that each guides light signals to and/or from one or more optical components. Examples of suitable optical components include, but are not limited to, facets through which light signals can enter and/or exit a waveguide, a taper for changing the mode size of a light signal guide by the waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, light sensors such as sensors that convert all or a portion of the light signal to an electrical signal, amplifiers for amplifying the intensity of a light signal, attenuators for attenuating the intensity of a light signal, modulators for modulating a signal onto a light signal, modulators that convert a light signal to an electrical signal, and vias that provide an optical pathway from the bottom side of a device to the top side of the device. Although not illustrated, the devices can optionally include electrical devices.

One or more of the optical components can include electrical components. For instance, the optical components can include contact pads (not shown) for making electrical contact with electronics that are external to the device. As an example, a laser can include contact pads that are to be electrically connected to laser driving electronics that are external to the device. Other optical components that may include contact pads for operating the component include, but are not limited to, light sensors, modulators, amplifiers, attenuators, polarizers, polarization splitters, and heaters.

The waveguide 14 ends at a facet 16 located at a lateral side 20 of the device. The light signals guided by the waveguide 14 can enter and/or exit the waveguide 14 through the facet 16. A light guiding device such as an optical fiber 18 is positioned so as to exchange light signals with the waveguide 14. Accordingly, the optical fiber 18 is optically aligned with the facet 16 of the waveguide 14. Although FIG. 1B illustrates a single waveguide 14 that terminates at a facet 16 positioned at an edge of the device, these devices can include more than one waveguide 14 that terminates at a facet 16 positioned at an edge of the device and/or one or more other waveguides 14.

Figure 2A:
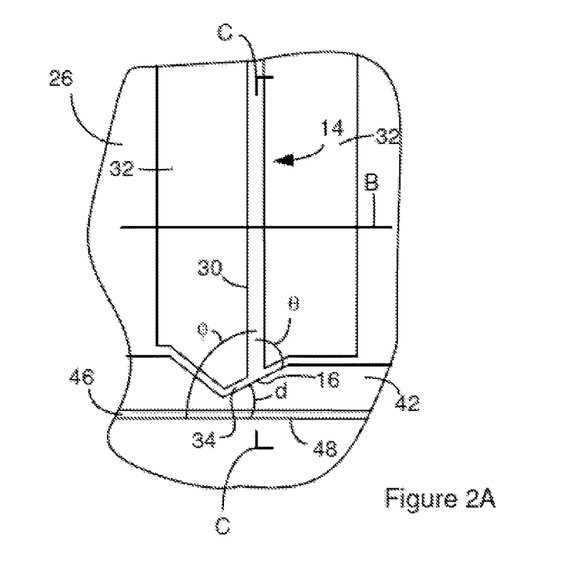
FIG. 2A is a topview of the device.
Figure 2B:
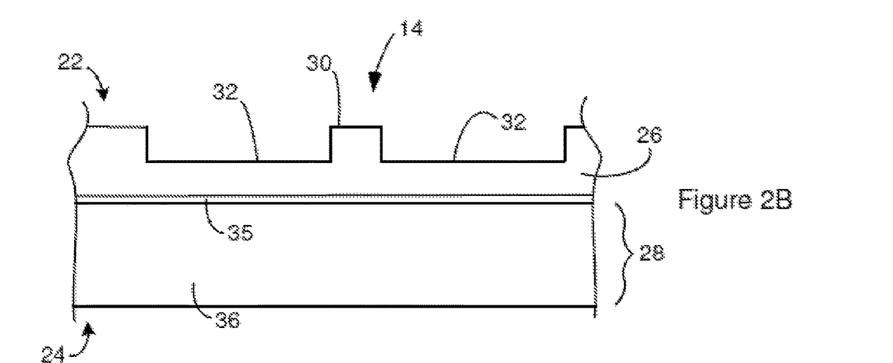
FIG. 2B is a cross section of the device taken along the line labeled B in FIG. 2A.
Figure 2C:
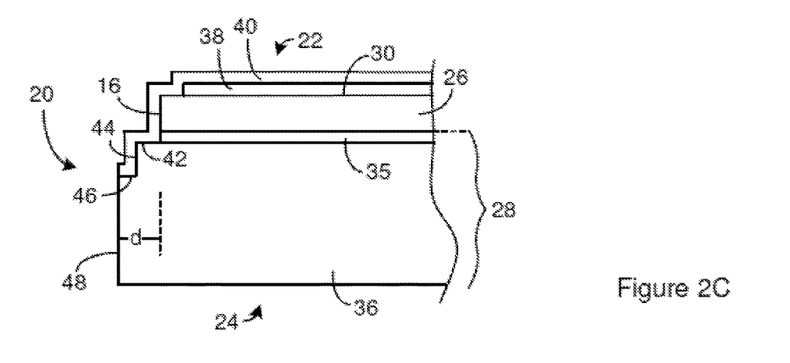
FIG. 2C is a cross section of the device taken along the longitudinal axis of the waveguide.

FIG. 2A through FIG. 2C illustrate a portion of an optical device that includes a waveguide 14 and a facet 16. FIG. 2A is a topview of the device. FIG. 2B is a cross section of the device taken along the line labeled B in FIG. 2A. FIG. 2C is a cross section of the device taken along the longitudinal axis of the waveguide 14. For instance, FIG. 2C is a cross section of the device taken along a line extending between the brackets labeled C in FIG. 2A. In some instance, the portion of the device illustrated in FIG. 2A through FIG. 2C represents a portion of one or more of the devices illustrated in FIG. 1A through FIG. 1B.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the top side of the base, the bottom side of the base, the top side of the substrate, and/or the bottom side of the substrate.

The illustrated device includes lateral sides 20 (or edges) extending from a top side 22 to a bottom side 24. The propagation direction of light signals along the length of the waveguides on a planar optical device generally extends through the lateral sides 20 of the device. The top side and the bottom side of the device are non-lateral sides.

The waveguide 14 is defined in a light-transmitting medium 26 positioned on a base 28. The waveguide 14 is partially defined by a ridge 30 extending upward from slab regions of the light-transmitting medium 26. In some instances, the top of the slab region is defined by the bottom of trenches 32 extending partially into the light-transmitting medium 26 or through the light-transmitting medium 26. A flange ridge 34 is also defined in the light-transmitting medium 26 and extends outwards from the ridge 30 at the facet 16. The flange ridge 34 can be an artifact of the fabrication process and, in some instances, is not present in the optical device. Suitable light-transmitting media include, but are not limited to, silicon, polymers, silica, SiN, GaAs, InP and $LiNbO_3$.

The portion of the base 28 adjacent to the light-transmitting medium 26 is configured to reflect light signals from the waveguide 14 back into the waveguide 14 in order to constrain light signals in the waveguide 14. For instance, the portion of the base 28 adjacent to the light-transmitting medium 26 can be an optical insulator 35 with a lower index of refraction than the light-transmitting medium 26. The drop in the index of refraction can cause reflection of a light signal from the light-transmitting medium 26 back into the light-transmitting medium 26. The base 28 can include the optical insulator 35 positioned on a substrate 36. As will become evident below, the substrate 36 can be configured to transmit light signals. For instance, the substrate 36 can be constructed of a light-transmitting medium 26 that is different from the light-transmitting medium 26 or the same as the light-transmitting medium 26. In one example, the device is constructed on a silicon-on-insulator wafer. A silicon-on-insulator wafer includes a silicon layer that serves as the light-transmitting medium 26. The silicon-on-insulator wafer also includes a layer of silica positioned on a silicon substrate. The layer of silica can serve as the optical insulator 35 and the silicon substrate can serve as the substrate 36.

As is evident from FIG. 2C, a cladding 38 can optionally be positioned on the device. The cladding 38 can be arranged so it is located on the waveguide 14 without being located over the facet 16. For instance, the cladding 38 can be in direct physical contact with the ridge 30 of the light-transmitting medium 26 and the slab regions without being in direct physical contact with the facet 16. Suitable claddings 38 include, but are not limited to, silica and silicon nitride.

As is also shown in FIG. 2C, an anti-reflective coating 40 can be positioned on the device. For instance, the anti-reflective coating 40 can be positioned over the facet 16 such that light signals that enter and/or exit the waveguide 14 through the facet 16 also pass through the anti-reflective coating 40. In some instances, the anti-reflective coating 40 is in direct physical contact with the facet 16. Suitable anti-reflective coatings 40 include, but are not limited to, silica, silicon nitride, aluminum oxide, and hafnium oxide.

A facet shelf 42 extends outward from the facet 16 to a recess wall 44. In some instances, the facet shelf 42 is parallel or substantially parallel to the top of the base 28 and/or the top of the substrate 36. A recess shelf 46 extends outwards from the recess wall 44 to an edge wall 48. In some instances, the edge wall 48 is the outermost edge of the optical device. Additionally or alternately, the edge wall 48 is perpendicular or substantially perpendicular to the recess shelf 46 and/or the bottom of the substrate 36. As will be evident below, the edge wall 48 can be the portion of the device that is closest to the end of an optical fiber 18 that is exchanging light signals with the waveguide 14 through the facet 16.

The facet 16 extends upwards from the base 28. In some instances, the facet 16 is vertical or substantially vertical relative to the base 28. The facet 16 can also be positioned at an angle that is non-perpendicular relative to the direction of propagation of light signals through the waveguide 14 at the facet 16. In some instances, the facet 16 is substantially perpendicular relative to the base 28 while being non-perpendicular relative to the direction of propagation. The non-perpendicularity of the facet 16 reduces the effects of back reflection. Suitable angles (labeled θ in FIG. 2A) for the facet 16 relative to the direction of propagation include but are not limited to, angles between 80° and 89°, and angles between 80° and 85°. An angle (labeled φ in FIG. 2A) between the direction of propagation of light signals through the waveguide 14 at the facet 16 and the plane of the edge wall 48 or the edge of the device can be 90° or substantially 90° or less than 90°. For instance, the angle φ can be greater than 70° or 80° and/or less than 80° or 90°. The angle φ and the angle θ can be selected such that the light signals travels away from the facet 16 at a particular angle and/or enter the waveguide at a particular angle. For instance, the angle φ and the angle θ can be selected such that light signals exiting from the waveguide travel away from the device at an angle that is perpendicular or substantially perpendicular to the plane of the edge wall 48 and/or perpendicular or substantially perpendicular to an edge of the device. Additionally or alternately, the angle φ and the angle θ can be selected such that light signals entering the waveguide travel through the waveguide in a direction that is parallel or substantially parallel to the direction of propagation of light signals through the waveguide 14 at the facet 16.

A displacement distance is labeled "d" in FIG. 2A and FIG. 2C. The displacement distance is the distance that the edge wall 48 is displaced from the facet 16 in a direction perpendicular to a lateral side 20 of the device. As a result, the displacement distance is a measure of the displacement between the facet 16 and the portion of the device that is closest to the end of an optical fiber 18 exchanging light signals with the waveguide 14 through the facet 16. As discussed above, the facet 16 can have an angle θ relative to the direction of propagation through the waveguide 14. As a result, the distance that the facet 16 is displaced from the edge wall 48 can be variable as is evident in FIG. 2A. As a result, the displacement distance is the shortest distance that waveguide ridge 30 is displaced from the edge wall 48 as labeled in FIG. 2A.

As is most evident in FIG. 2C, the displacement distance is not the shortest distance between the waveguide ridge 30 and the edge wall 48 but is instead the shortest distance that the plane of the edge wall 48 is displaced from the ridge 30. In other words, it is the shortest distance that the ridge 30 can be move laterally before a portion of the ridge 30 or facet becomes aligned with the edge wall 48. Alignment with the edge wall 48 can be location of at least a portion the ridge 30 or facet directly over the edge wall 48 and/or location of at least a portion of the ridge 30 or at least a portion of the facet in the plane of the edge wall 48. Using the methods of fabrication described below, the displacement distance can be greater than or equal to 0 µm, 1 µm, 2 µm, or 3 µm and/or less than 4 µm, 5 µm, or 6 µm. Additionally or alternately, the recess shelf 46 can have a width greater than or equal to 0 µm, 0.1 µm, 0.2 µm or 0.3 µm and/or less than 0.5 µm, 1.0 µm, or 1.5 µm. Additionally or alternately, the facet shelf 42 can be greater than or equal to, 0 µm, 0.1 µm, 0.2 µm or 0.3 µm and/or less than 0.5 µm, 1.0 µm, or 1.5 µm.

Figure 3A:
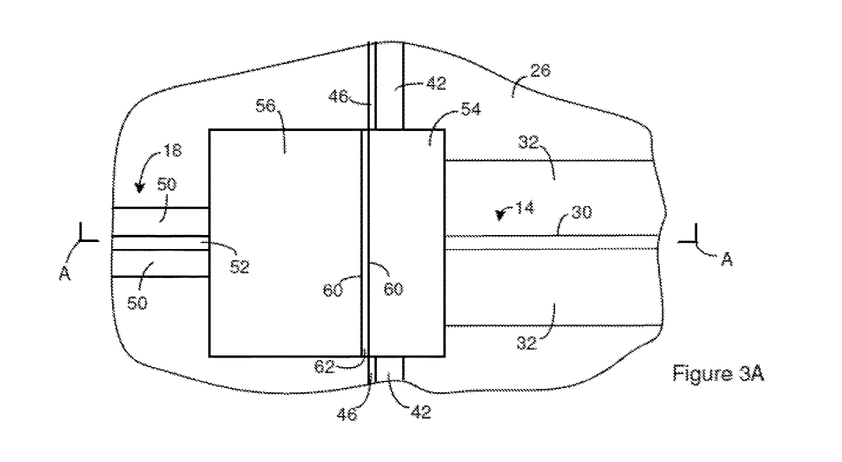
FIG. 3A is a topview of the system.
Figure 3B:
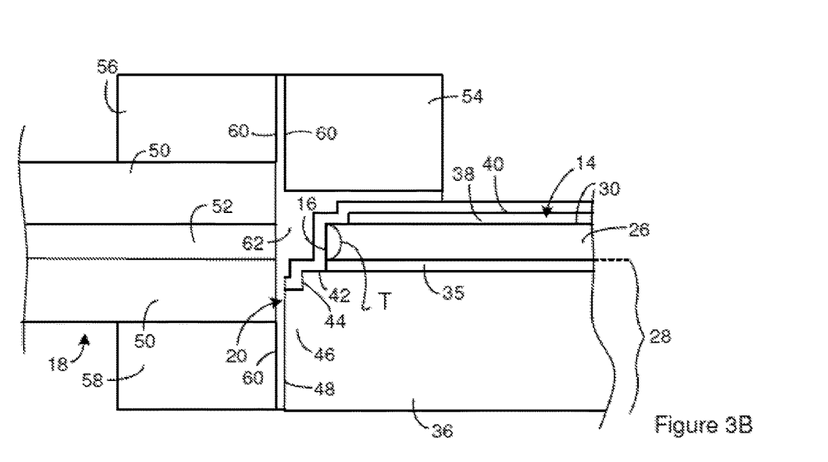
FIG. 3B is a cross section of the system shown in FIG. 3A taken along a line extending between the brackets labeled A in FIG. 3A.

The optical device can be interfaced with a light guiding device such that the waveguide 14 can exchange light signals with the light guiding device. For instance, FIG. 3A and FIG. 3B illustrate a system having an optical fiber 18 interfaced with the optical device of FIG. 2A through FIG. 2C. FIG. 3A is a topview of the system. FIG. 3B is a cross section of the system shown in FIG. 3A taken along a line extending between the brackets labeled A in FIG. 3A. The optical fiber 18 has a cladding 50 surrounding a core 52. In some instances, the core 52 has a diameter greater than 1 µm, 2 µm, or 3 µm and/or less than 4 µm, 7 µm or 10 µm. Additionally or alternately, in some instances, the cladding 50 has a thickness greater than 40 µm, 50 µm, or 60 µm and/or less than 70 µm, 80 µm or 90 µm.

The system can include a device mount 54 positioned on the optical device. In some instances, the device mount adds mechanical strength to the assembly. The device mount 54 can be immobilized on the optical device using one or more attachment mechanisms selected from a group consisting of adhesives and/or epoxies. The device mount 54 can be positioned over the ridge 30 and can span the trenches 32. Suitable device mounts 54 include, but are not limited to, blocks. In some instances, the device mounts 54 include or consist of a glass block such as a silica block.

The system also includes an upper mount 56 and a lower mount 58. The upper mount 56 is immobilized relative to the lower mount 58 with the optical fiber 18 being positioned between the upper mount 56 and the lower mount 58 and immobilized relative to the upper mount 56 and the lower mount 58. Although not illustrated, the optical fiber 18 can be positioned in a groove in the upper mount 56 and/or a groove in the lower mount 58. Suitable mechanisms for immobilizing the upper mount 56, the lower mount 58, and the optical fiber 18 include one or more attachment mechanisms selected from a group consisting of adhesives and/or epoxies. Suitable upper mounts 56 and/or suitable lower mounts 58 members include, but are not limited to, blocks. In some instances, the upper mount 56 and/or lower mount 58 includes or consists of a glass block such as a silica block.

The upper mount 56 and the device mount 54 each include one or more alignment surfaces 60. An alignment surface 60 from the upper mount 56 is bonded to an alignment surface 60 from the device mount 54 such that a core 52 of the optical fiber 18 is optically aligned with the facet 16 of the waveguide 14. Alternately, the mount includes one or more alignment surfaces 60 and the edge wall 48 serves as an alignment surface 60. An alignment surface 60 from the lower mount 58 is bonded to the edge wall 48 such that a core 52 of the optical fiber 18 is optically aligned with the facet 16 of the waveguide 14. In some instances, alignment surfaces 60 from the upper mount 56 and device mount 54 are bonded and alignment surfaces 60 from the lower mount 58 and edge wall 48 are bonded such that a core 52 of the optical fiber 18 is optically aligned with the facet 16 of the waveguide 14.

Suitable mechanisms for bonding the alignment surfaces 60 include, but are not limited to, attachment mechanisms selected from a group consisting of adhesives and/or epoxies. As is evident from FIG. 3B, the attachment mechanism 62 can be located between the alignment surfaces 60 and can also be located between the optical fiber 18 and the optical device. For instance, the attachment mechanism 62 can be located between the core 52 of the optical fiber 18 and facet 16 and/or the attachment mechanism 62 can be located between the cladding 50 of the optical fiber 18 and the lateral side 20 of the optical device. As a result, the use of the upper mount 56, the lower mount 58, and the device mount 54 are optional. Further, one or more of the upper mount 56, the lower mount 58, and the device mount 54 can be included in the system without being attached to an alignment surface 60. For instance, the bonding of the upper mount 56 and the device mount 54 is optional when the lower mount 58 and edge wall 48 are bonded. The bonding of the lower mount 58 and the edge wall 48 is optional when the upper mount 56 and device mount 54 are bonded.

As is evident from the continuous layer of attachment mechanism 62 shown in FIG. 3B, the attachment mechanism 62 that bonds the optical fiber 18 to the optical device can optionally be the same as the attachment mechanism 62 that attached the device mount 54 to the optical device.

When the system includes an attachment mechanism 62 between alignment surfaces 60 as disclosed above, the attachment mechanism 62 can have a thickness greater than or equal to 0 µm, 1 µm, or 2 µm and/or less than 5 µm, 10 µm, or 15 µm. As a result, the distance between the facet of the optical fiber 18 and the facet 16 can be greater than or equal to 0 µm, 1 µm, or 2 µm and/or less than 3 µm, 5 µm, 10 µm, or 15 µm.

In the device of FIG. 3A and FIG. 3B, the angle φ, and the angle θ can be selected such that the light signals travels away from the device in a direction that is perpendicular or substantially perpendicular to the plane of the edge wall 48 and/or perpendicular or substantially perpendicular to an edge of the device. Additionally or alternately, the angle φ, and the angle θ can be selected such that when the optical fiber is perpendicular or substantially perpendicular to the plane of the edge wall 48 and/or perpendicular or substantially perpendicular to an edge of the device, light signals from the optical fiber enter the waveguide traveling in a direction that is parallel or substantially parallel to the direction of propagation of light signals through the waveguide 14 at the facet 16. In one example, the attachment mechanism 62 is an epoxy with an index of refraction of about 1.5, the angle θ is 83° and the angle φ, is 80.34°.

FIG. 4A through FIG. 4J illustrate a method for generating an optical device constructed according to FIG. 2A through FIG. 2C. The method is illustrated using a silicon-on-insulator wafer although other wafer platforms can be employed.

Figure 4A:
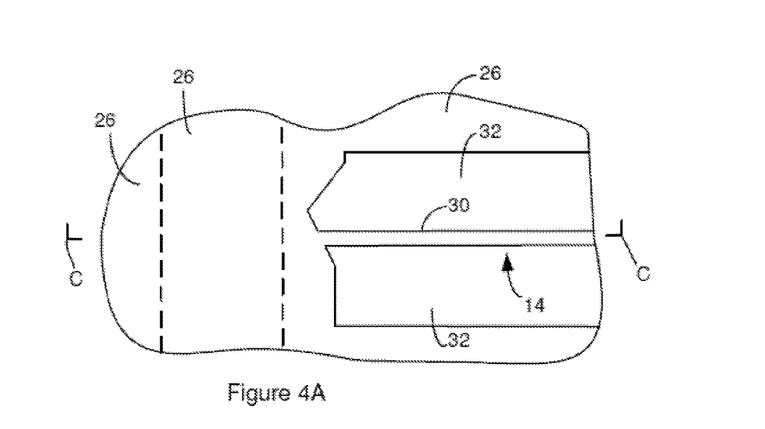
FIG. 4A is a topview of a portion of the wafer that will include a portion of two different dies that each becomes one of the final optical device or a precursor for the final optical devices.

FIG. 4A is a topview of a portion of the wafer that will include a portion of two different dies 10 that each becomes one of the final optical device or a precursor for the final optical devices. The dashed lines in FIG. 4A illustrate the locations where the lateral sides of the two different dies 10 will be formed. The wafer is obtained with the trenches 32 in the desired locations. The trenches 32 can be formed using masking and etching techniques. Although not shown, one or more optical components can also be fully or partially formed on the dies 10 in the wafer.

Figure 4B:
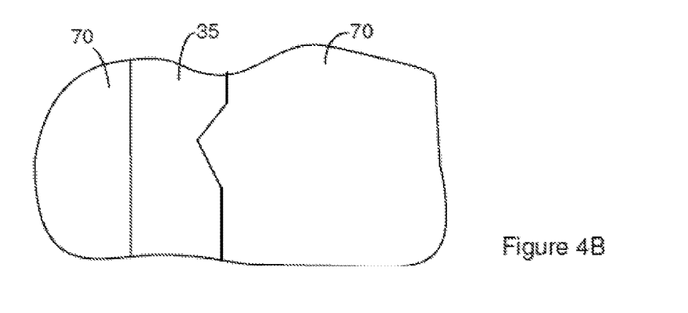
FIG. 4B is a topview of the wafer after formation of a first mask on the wafer of FIG. 4A followed by etching of the wafer.
Figure 4C:
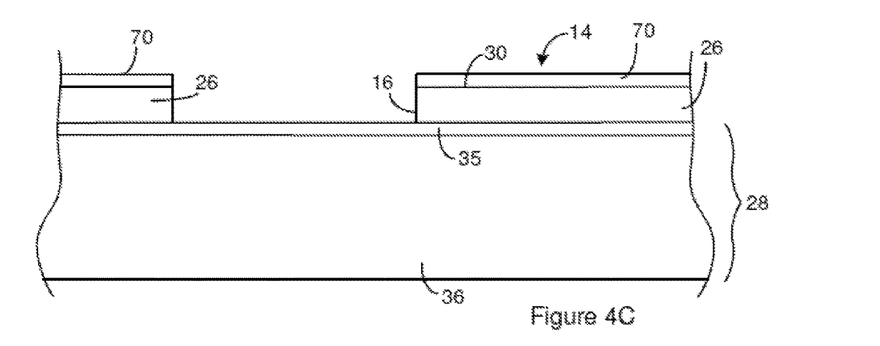
FIG. 4C is a cross section of the wafer shown in FIG. 4B taken along the longitudinal axis of the waveguide.

A first mask 70 is formed on the wafer of FIG. 4A and a facet etch is then performed so as to provide an optical device with the structure of FIG. 4B and FIG. 4C. FIG. 4B is a topview of the wafer. FIG. 4C is a cross section of the wafer taken along the longitudinal axis of the waveguide 14. For instance, FIG. 4C can be a cross section of the die 10 shown in FIG. 4B taken along a line between the brackets labeled C in FIG. 4A. The first mask 70 protects each of the dies 10 with the edge of the mask positioned so as to define the location of the facet 16 and a side of the flange ridge 34. As a result, the facet etch removes light-transmitting medium 26 from between the dies 10 and defines the facets 16 located at the edges of the dies 10 on the wafer. The facet etch can be selected so the optical insulator 35 acts as an etch stop and/or the facet etch can be performed for a duration needed to expose the optical insulator 35. Alternately, the facet etch can be performed for a duration needed to etch through the optical insulator 35. While etching through the optical insulator 35 is optional at this point, etching through the optical insulator 35 will provide an optical device having a cross section according to FIG. 2C. A suitable first mask 70 includes, but is not limited to, silica or silicon nitride.

Figure 4D:
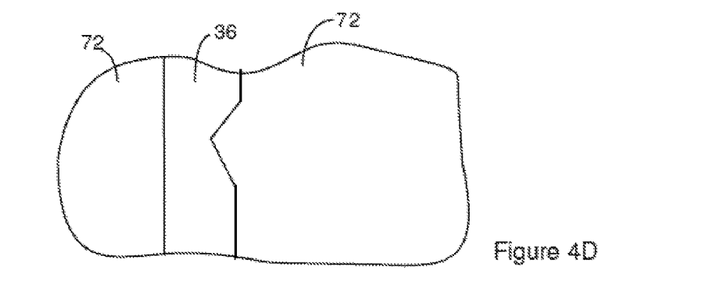
FIG. 4D is a topview of the wafer after removal of the first mask and formation of a second mask on the wafer of FIG. 4B and FIG. 4C followed by etching of the wafer.
Figure 4E:
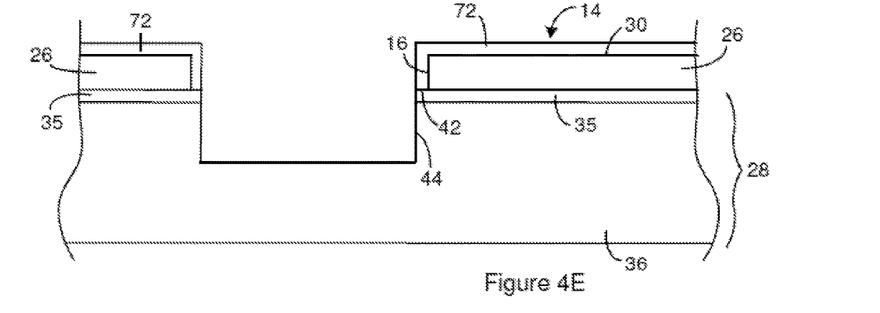
FIG. 4E is a cross section of the wafer shown in FIG. 4D taken along the longitudinal axis of the waveguide.

The first mask 70 is removed from the wafer of FIG. 4B and FIG. 4C and a second mask 72 is formed on the wafer. A recess etch is performed on the resulting wafer so as to provide the wafer of FIG. 4D and FIG. 4E. FIG. 4D is a topview of the wafer. FIG. 4E is a cross section of the wafer taken along the longitudinal axis of the waveguide 14. The second mask 72 protects each of the dies 10 and also the previously formed facet 16. For instance, the second mask 72 can be positioned over the facet 16 and in direct contact with the facet 16 as shown in FIG. 4D. The recess etch is performed so as to form a recess between the different dies 10 on the wafer. The recess can extend into the base 28. Since the recess includes the recess wall 44, the recess etch forms the recess wall 44. Accordingly, the recess etch is performed for a duration that provides the recess wall 44 with the desired depth. For instance, the recess etch can be performed for a duration that provides a recess wall 44 with a height greater than 5 µm, 7 µm, or 10 µm and/or less than 15 µm, 20 µm, or 30 µm. The recess etch also forms the facet shelf 42. The second mask 72 defines the width of the facet shelf 42. For instance, the thickness of the portion of the second mask 72 over the facet (labeled T in FIG. 4E) determines the thickness of the facet shelf 42. A suitable first mask 70 includes, but is not limited to, silica or silicon nitride.

Figure 4F:
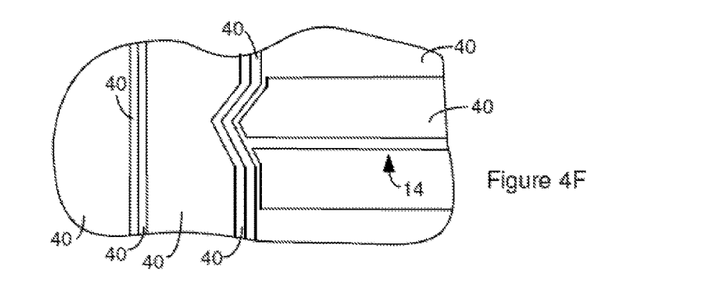
FIG. 4F is a topview of the wafer after the second mask is removed, and a cladding and anti-reflective coating are formed on the wafer of FIG. 4D and FIG. 4E.
Figure 4G:
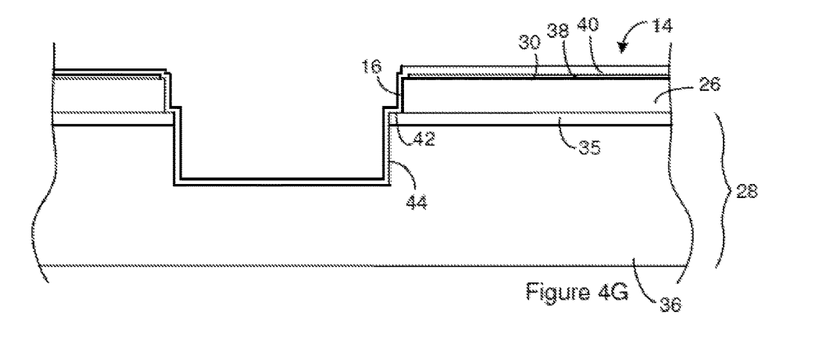
FIG. 4G is a cross section of the wafer shown in FIG. 4F taken along the longitudinal axis of the waveguide.

The second mask 72 is removed from the wafer of FIG. 4D and FIG. 4E. The cladding 38 and anti-reflective coating 40 can be formed on the resulting wafer as shown in FIG. 4F and FIG. 4G. FIG. 4F is a topview of the wafer. FIG. 4G is a cross section of the wafer taken along the longitudinal axis of the waveguide 14. Suitable method for forming the cladding 38 on the wafer include, but are not limited to, sputtering, evaporation, and chemical vapor deposition (CVD). Suitable method for patterning the cladding 38 include, but are not limited to, wet etch or dry etch. Suitable method for forming the anti-reflective coating 40 cladding 38 on the wafer include, but are not limited to, sputtering, evaporation, and CVD.

Figure 4H:
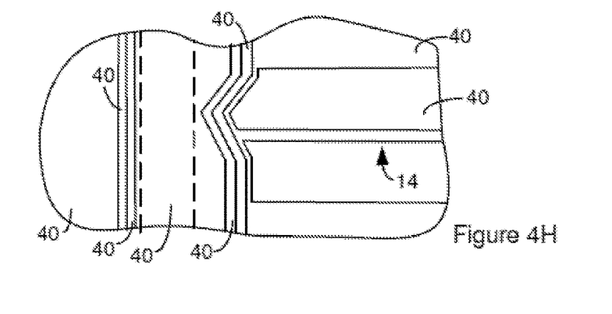
FIG. 4H is a topview of the wafer including dashed lines that show where dies on the wafer are separated from the wafer.
Figure 4I:
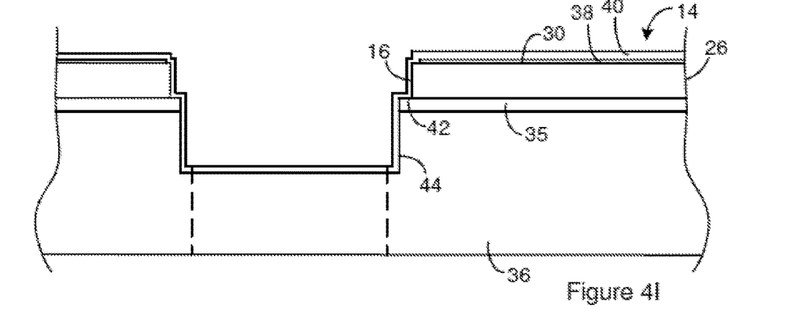
FIG. 4I is a cross section of the wafer shown in FIG. 4H taken along the longitudinal axis of the waveguide.
Figure 4J:
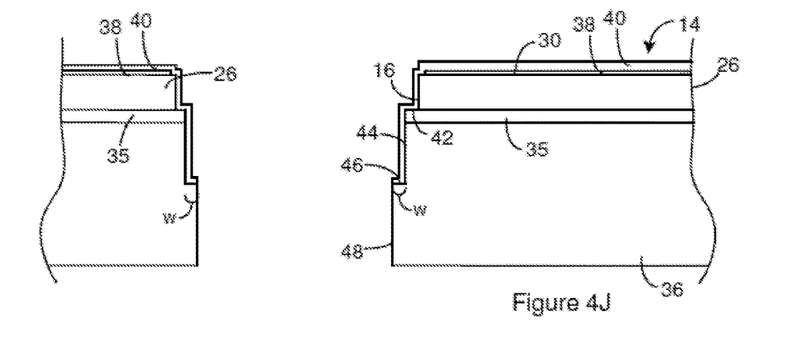
FIG. 4J is a cross section of the dies shown in FIG. 4I after separation of the dies from the wafer. The cross section is taken along the longitudinal axis of the waveguide.

The individual dies 10 on the wafer can then be separated from the wafer. For instance, the wafer can be diced so as to remove the individual dies 10 from the wafer. For instance, the wafer of FIG. 4F and FIG. 4G can be diced along the dashed lines shown in FIG. 4H and FIG. 4I so as to provide the dies 10 illustrated in FIG. 4J. FIG. 4H is a topview of the wafer. FIG. 4I is a cross section of the wafer taken along the longitudinal axis of the waveguide 14. FIG. 4J is a cross section of the dies 10 shown in FIG. 4I taken along the longitudinal axis of the waveguide 14. A comparison of FIG. 4I and FIG. 4J shows that the recess shelf 46 is formed by the separation of the dies 10 from the wafer. The Applicants have found that dicing processes can provide a recess shelf 46 with a surprisingly low width (labeled W in FIG. 4J). A dicing process typically uses mechanical sawing with a dicing saw. A dicing saw typically includes a high speed spindle fitted with a circular cutting blade. The blade material, typically stainless steel, may be coated with diamond. During dicing, the wafers are mounted on dicing tape. After dicing a wafer expander is generally used to separate the die and allow easy removal from the dicing tape without damaging the die. For instance, the inventors have found that the DAD3350 with auto kerf checking, with dicing blade R07-SD2000-BB200-50-A4722, available from the Disco Corporation located in Tokyo Japan can provide a recess shelf 46 with a width greater than or equal to 0.0 μm, 0.2 μm, 0.5 μm, or 1 μm and/or less than 1.5 μm, 2 μm, or 10 μm. Accordingly, the above method can provide a displacement distance greater than or equal to 0.0 μm, 0.2 μm, 0.5 μm, or 1 μm and/or less than 2 μm, 4 μm, or 10 μm.

Although FIG. 4H and FIG. 4I illustrates two different lines of separation (dashed lines), in some instances, the recess between the dies 10 is sufficiently small that a single line of separation is between the dies 10. Accordingly, a single separation step may provide the separation between adjacent dies 10. For instance, a single dicing operation may provide the desired separation of adjacent dies 10.

The facet etch and the recess etch can be different etches. For instance, the facet etch can be a fine etch while the recess etch is a coarse etch. Since the facet etch forms the facet 16, the facet etch is selected to provide a smooth surface. For instance, the facet etch can be selected to provide a facet 16 with a roughness less than 5 nm, 10 nm, or 20 nm. However, the recess wall 44 formed by the recess etch does not have strict smoothness requirements. As a result, the recess etch can be selected to etch the base 28 at a much quick rate than the facet etch etches the light-transmitting medium. For instance, the recess etch can etch the substrate 36 and optical insulator 35 at a quicker rate that the facet etch etches the light-transmitting medium or the recess etch can etch the substrate 36 at a quicker rate that the facet etch etches the light-transmitting medium 26. In some instances, the vertical etch rate of the recess etch is more than 2, 3, or 4 time the vertical etch rate of the facet etch. The quicker rate of the recess etch can result in the recess wall 44 having a rougher surface than the facet 16. For instance, the roughness of the recess wall 44 can be more than 2, 3, or 4 times the roughness of the facet 16.

Although the optical device and system are disclosed in the context of single waveguide and facet, the single optical device and/or system can include multiple waveguides and/or facets. For instance, the above method can be employed to concurrently fabricate multiple facets on the same device. Additionally, more than one optical fiber can be positioned between and/or held by the mounts and aligned with the same device.

Although separation of the dies from the wafer is described in the context of dicing, other methods of separation can be employed. Examples of other suitable separation methods include, but are not limited to, laser cutting, or scribe and break.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A method of forming an optical device, comprising:
obtaining a wafer having multiple optical device dies that each includes a waveguide;
forming a facet on the waveguide of different dies; and
separating the dies from the wafer after forming the facets, the dies being separated from the wafer such that the facets are positioned at an edge of the dies, and separating the dies forms an edge wall at a lateral side of at least one of the dies such that the edge wall has a displacement distance of less than 2 μm from the facet, the displacement distance being the shortest distance that the waveguide on the at least one die can moved laterally before a portion of the waveguide is aligned with the edge wall.

2. The method of claim 1, wherein forming the facet includes etching the facet.

3. The method of claim 2, wherein etching the facet provides the facet with a roughness less than 20 nm.

4. The method of claim 1, wherein separating the dies includes dicing the wafer.

5. The method of claim 1, further comprising:
forming an anti-reflective coating over the facets before separating the dies.

6. The method of claim 1, further comprising:
forming a recess between adjacent dies after forming the facets and before separating the dies.

7. The method of claim 6, wherein the wafers includes a light-transmitting medium on a base, the waveguide is configured to guide a light signal through the light-transmitting medium, and the recess extends at least 10 μm into the base.

8. The method of claim 6, wherein the dies are separated such that a portion of a bottom of the recess becomes a shelf extending outward from at least one of the separated dies.

9. The method of claim 1, further comprising:
attaching an optical fiber to one of the separated dies such that the optical fiber is optically aligned with the facet.

10. The method of claim 9, wherein a facet of the optical fiber is less than 20 μm from the facet on the die.

11. The method of claim 1, wherein at least one of the dies has the facet at a non-perpendicular angle relative to a direction of propagation of light signals through the waveguide at the facet, the facet having the non-perpendicular angle before separating the dies from the wafer.

12. The method of claim 1, wherein at least one of the separated dies is constructed such that the facet is positioned above a facet shelf that extends outward from the facet to a recess wall,
a recess shelf extends outwards from the recess wall to an edge wall, the edge wall being an outermost side of the optical device.

13. A method of forming an optical device, comprising:
obtaining a wafer having multiple optical device dies that each includes a waveguide;
forming a facet on the waveguide of different dies; and
separating the dies from the wafer after forming the facets, the dies being separated from the wafer such that the facets are positioned at an edge of the dies,
at least one of the separated dies is constructed such that the facet is positioned above a facet shelf that extends outward from the facet to a recess wall, a recess shelf extends outwards from the recess wall to an edge wall with the edge wall being an outermost side of the optical device; and
attaching an optical fiber to one of the separated dies such that the optical fiber is optically aligned with the facet, the optical fiber being positioned such that an imaginary line can be drawn perpendicular to an end of the optical fiber and through the edge wall.

14. The method of claim 13, wherein separating the dies forms an edge wall at a lateral side of at least one of the dies such that the edge wall has a displacement distance of less than 2 μm from the facet, the displacement distance being the shortest distance that the waveguide on the at least one die can moved laterally before a portion of the waveguide is aligned with the edge wall.

15. The method of claim 13, wherein forming the facet includes etching the facet and etching the facet provides the facet with a roughness less than 20 nm.

16. The method of claim 13, wherein separating the dies includes dicing the wafer.

17. The method of claim 13, further comprising:
   forming a recess between adjacent dies after forming the facets and before separating the dies.

18. The method of claim 17, wherein the wafers includes a light-transmitting medium on a base, the waveguide is configured to guide a light signal through the light-transmitting medium, and the recess extends at least 10 μm into the base.

19. The method of claim 17, wherein the dies are separated such that a portion of a bottom of the recess becomes a shelf extending outward from at least one of the separated dies.

20. The method of claim 13, wherein a facet of the optical fiber is less than 20 from the facet on the die.

* * * * *